United States Patent
Wang et al.

(10) Patent No.: US 7,432,210 B2
(45) Date of Patent: Oct. 7, 2008

(54) PROCESS TO OPEN CARBON BASED HARDMASK

(75) Inventors: Judy Wang, Cupertino, CA (US);
Shing-Li Sung, Hsin-Chu (TW);
Shawming Ma, Sunnyvale, CA (US);
Bryan Pu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 330 days.

(21) Appl. No.: 11/244,422

(22) Filed: Oct. 5, 2005

(65) Prior Publication Data

US 2007/0077780 A1 Apr. 5, 2007

(51) Int. Cl.
*H01L 21/31* (2006.01)
*H01L 21/469* (2006.01)

(52) U.S. Cl. .............. 438/710; 438/725; 438/737; 257/E21.253; 257/E21.257

(58) Field of Classification Search .............. 438/710, 438/725, 737
See application file for complete search history.

(56) References Cited

U.S. PATENT DOCUMENTS

| 6,528,751 | B1 | 3/2003 | Hoffman et al. | 219/121.43 |
| 6,573,030 | B1 | 6/2003 | Fairbairn et al. | 430/323 |
| 6,838,635 | B2 | 1/2005 | Hoffman et al. | 219/121.43 |
| 6,853,141 | B2 | 2/2005 | Hoffman et al. | 315/111.21 |
| 6,894,245 | B2 | 5/2005 | Hoffman et al. | 219/121.43 |
| 7,235,478 | B2 * | 6/2007 | Geng et al. | 438/634 |
| 2004/0214446 | A1 | 10/2004 | Kim et al. | 438/706 |
| 2005/0167051 | A1 | 8/2005 | Hoffman et al. | 156/345.46 |
| 2005/0167394 | A1 * | 8/2005 | Liu et al. | 216/41 |
| 2005/0199585 | A1 | 9/2005 | Wang et al. | 216/67 |

* cited by examiner

*Primary Examiner*—Alexander G Ghyka
(74) *Attorney, Agent, or Firm*—Law Offices of Charles Guenzer

(57) ABSTRACT

A method of opening a carbon-based hardmask layer composed of amorphous carbon containing preferably at least 60% carbon and between 10 and 40% hydrogen. The hardmask is opened by plasma etching using an etching gas composed of $H_2$, $N_2$, and CO. The etching is preferably performed in a plasma etch reactor having an HF biased pedestal electrode and a capacitively VHF biased showerhead.

9 Claims, 3 Drawing Sheets

PROCESS TO OPEN CARBON BASED HARDMASK

FIELD OF THE INVENTION

The invention relates generally to etching of semiconductor integrated circuits. In particular, the invention relates to etching of masks containing a high carbon fraction.

BACKGROUND ART

Plasma etching is one process used in the definition of the structure of a silicon integrated circuit. One example involves the etching of via holes through a dielectric layer to form a vertical metallic interconnect structure, which in some advanced designs may simultaneously form the horizontal interconnect structure. The dielectric layer is conventionally formed of a material based on silicon dioxide, also called oxide. More advanced dielectrics have included fluorine or other dopants to reduce the dielectric constant. Yet other dielectric compositions may be used. The long established photolithographic process deposits a generally planar layer of photoresist material onto the unpatterned oxide with perhaps an anti-reflective coating (ARC) therebetween. The photoresist is optically patterned according to a desired patterned and then developed to remove the unexposed photoresist in positive lithography or exposed photoresist in negative lithography. The patterned photoresist then serves as a mask for a further step of etching the exposed oxide and intermediate ARC if present. Dielectric etch processes have been developed which provide a reasonable etch selectivity between the oxide and photoresist.

The advance of integrated circuit technology has depended in large part on the continuing shrinkage of the horizontal features such as the via holes through the oxide layer. Via widths are now decreasing to below 100 nm. However, the oxide thickness has held steady at around 1 μm and there are many structures in which oxide thicknesses of 3 μm or more are desired. Such high aspect ratios of the holes to be etched in the oxide layer have presented several problems between the photolithography and the etching. To maintain depth of field in the optical patterning, the thickness of the photoresist should not be much greater than the size of the feature being defined in the oxide layer, e.g., 100 nm in the above example. As a result, the etch selectivity, that is, the ratio of the oxide etch rate to the photoresist etch rate must be 10 or greater if the mask is to remain until the via hole has been etched to its bottom. However, photoresists are typically based on soft organic materials. Obtaining such high selectivity of photoresist has been difficult to achieve while simultaneously achieving other requirements such as vertical profiles in the narrow via holes.

It is desired to transition the lithography from 248 nm radiation for exposing the photoresist from a KrF layer to 193 nm radiation from an ArF laser. However, the 193 nm radiation presents problems. The photoresist sensitive to the shorter wavelengths is generally softer and the maximum thickness of the photoresist is generally reduced to less than 400 nm to accommodate the shallower depth of field at the shorter wavelength.

SUMMARY OF THE INVENTION

A method of etching a carbon-based layer, particularly for opening a hardmask of such material through a photoresist mask, by plasma etching in an etching gas comprising and preferably consisting of hydrogen, nitrogen, and carbon monoxide. The hardmask may be used as a mask for etching an underlying layer, such as a dielectric inter-metal layer requiring a high aspect-ratio via hole. The method is especially useful when the dielectric inter-metal layer is composed of a low-k dielectric.

The hydrogen and nitrogen are preferably supplied in a ratio of between 1:2 and 2:1. The chamber pressure is preferably maintained above 50 milliTorr.

The plasma etch chamber preferably includes a pedestal electrode biased by an HF power supply operating in the range of 1 to 143 MHz and a showerhead electrode operating in the range of 150 to 350 MHz.

DETAILED DESCRIPTION OF THE PREFERRED EMBODIMENTS

Etching selectivity can be increased by using a photoresist mask to pattern a hardmask intermediate the dielectric and photoresist layers. The generally thinner hardmask is more easily etched using the available photoresist and the tougher hardmask is used to pattern the thicker underlying dielectric layer. Hardmasks are needed in dielectric etching as the feature size decreases to less than 100 nm and using 193 nm photoresist patterning radiation available from an ArF laser. Hardmasks have been proposed in the past, typically composed of silicon nitride or silicon oxynitride. However, a particularly advantageous hardmask material is a carbon-based material such as Advanced Patterning Film (APF) available from Applied Materials, Inc. of Santa Clara, Calif. Its deposition by plasma enhanced chemical vapor deposition (PECVD) has been described by Fairbairn et al. in U.S. Pat. No. 6,573,030 using a hydrocarbon, for example, propylene $C_3H_6$, as a precursor. Wang et al. in U.S. Published Application 2005/0199585 and Lei et al. in U.S. Published Application 2005/0167394 have described its use as a hardmask. These three documents are incorporated herein by reference. Fairbairn has characterized this as being composed of at least 40 at % of carbon and between 10 and 60 at % of hydrogen and therefore of at least 40 at % of carbon. A tighter compositional range is, however, preferred of at least 60 at % of carbon and between 10 and 40 at % of hydrogen. Dopants have been proposed to control the dielectric constant and refractive index, but an APF inter-layer dielectric patterned through an effective anti-reflective coating does not seem to require substantial components other than carbon and hydrogen. It is believed to form as an amorphous material although its growth condition and precursors may change the crystallography. APF grown at 400° C. has been observed to have a density of 1.1 g/cm$^2$, a hardness of 2.2 MPa, a strength of 2.2 MPa, and an optimized C/H atomic ratio of 63/37. The ratio of single hydrocarbon bonds (C—H) to double hydrocarbon bonds (C=H) is observed to be 5. Recently developed APF grown at higher temperatures may show somewhat different characteristics.

Figure 1:
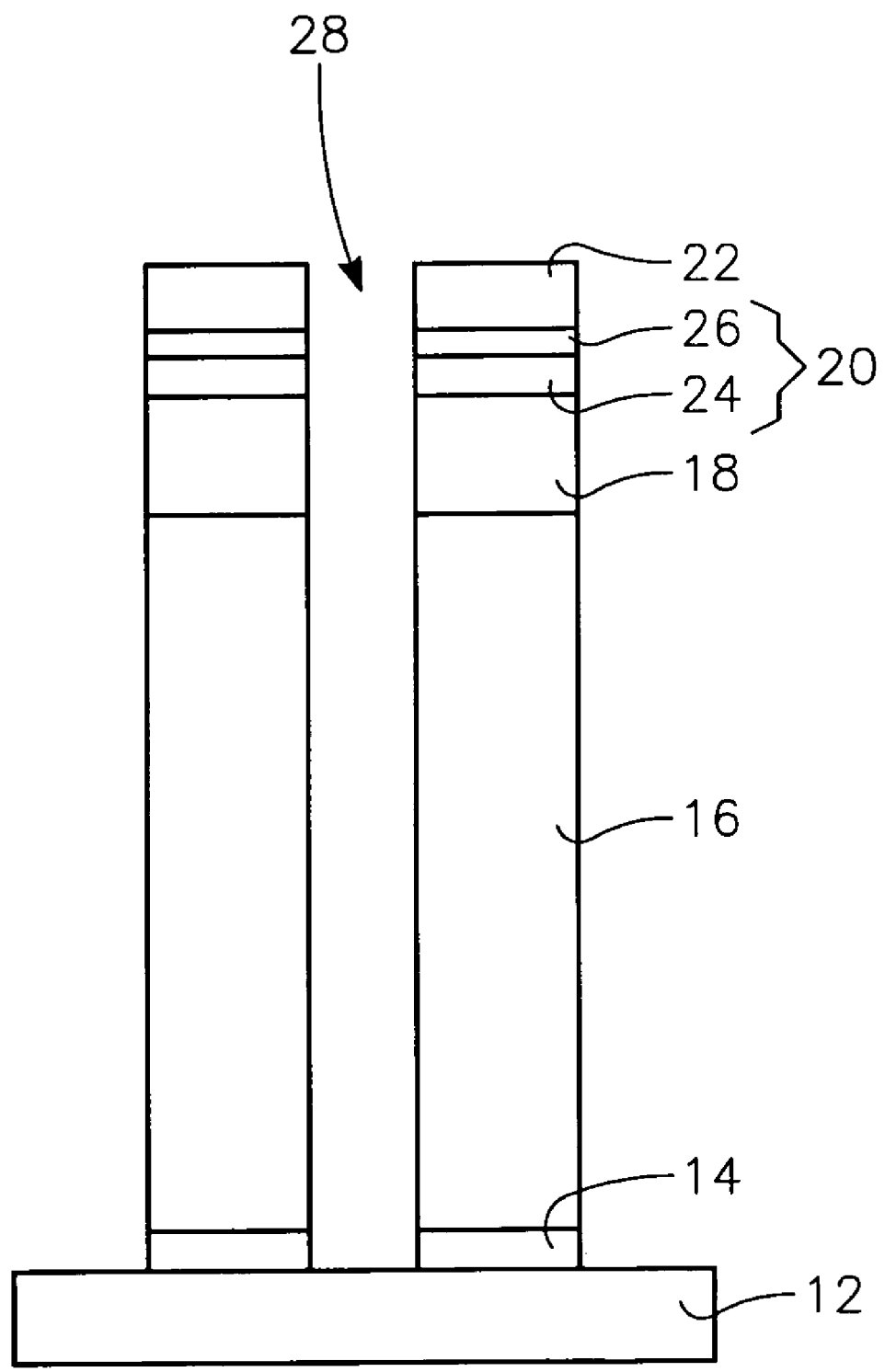
FIG. 1 is a cross-sectional view of an exemplary structure that can be formed according to the invention.

An example of a use of a carbon-based hardmask is illustrated in the cross sectional view of FIG. 1 for a contact via. However, it must be emphasized that the invention is not limited to this structure and may be applied to opening carbon-based layers other than APF over other materials. Over a silicon substrate 12 are deposited typically by chemical vapor deposition (CVD) an etch stop layer 14, for example, of silicon nitride, a dielectric layer 16, for example, of a low-k oxide doped with a halogen, and a carbon-based hardmask layer 18 to facilitate the photographic patterning of the after deposited photoresist layer 22, typically spun on in wet form and then dried. The ARC layer 20 includes a bottom DARC layer 24 of, for example, silicon oxynitride, and an upper BARC layer 26 of organic material. The DARC layer 24 is used in part to promote adhesion of the BARC layer 26 to the carbon-based hardmask layer.

The photoresist layer 22 is then photographically exposed through a reticle in a step and repeat exposer tool and developed to leave an aperture over the desired contact via 28. The BARC and DARC layers 26, 24 are then removed using conventional plasma etching, for example, using $CF_4$. Then the exposed areas of the carbon-based hardmask layer 18 are etched through or opened using the remaining portions of the patterned photoresist layer 26 or the ARC layer 18 as the etch defining. Thereafter a fluorine-based chemistry, for example, of $C_4F_6$ and Ar or other hydrogen-free or hydrogen-containing flurocarbon, etches through the dielectric layer 16 using the hardmask layer 18 as the mask for at least the final portions of the etch and stopping at the etch stop layer 14 because of the selective nature of the properly chosen fluorine-based oxide etch. The thin etch stop layer 14 is then removed by a sputter etch or relatively non-selective chemical plasma etch step, for example, using $CF_4$ or $O_2$ for the DARC and BARC, to expose the underlying silicon wafer 12 to allow its doping by ion implantation and contacting through a contact layer such as a refractory silicide and a metallization metal filled into the via hole. The remaining portion of the carbon-based hardmask layer 18 may be removed in an oxygen plasma. It is understood that the process can be easily extended to a dual damascene structure having a lower-level via hole and an upper-level trench for horizontal connections.

The opening of the hardmask layer should satisfy several different criteria. It should produce a vertical profile in the hardmask layer to maintain the critical dimension (CD) established by the photoresist patterning. For 100 nm features, the variation of the CD at the bottom of the opened hardmask should be less than 10 nm. For commercial production, the etch rate should be relatively high, for example, greater than 500 nm. Production of particles should be relatively low and not significantly increase during repeated cycling of the equipment. Because the hardmask layer typically has thickness of greater than 400 nm or 600 nm and via widths of less than greater than 200 nm are required, the etch should be highly anisotropic and produce vertical profiles. Particles may become a concern because of the fluorine-based oxide etching preferably performed in the same chamber as the opening of the hardmask.

An advantageous process for opening the carbon-based hardmask is based on the etching gas mixture of $H_2/N_2/CO$. The hydrogen and nitrogen are the primary etching species. The carbon monoxide provides sidewall passivation, which is important for maintaining the vertical profile.

Figure 2:
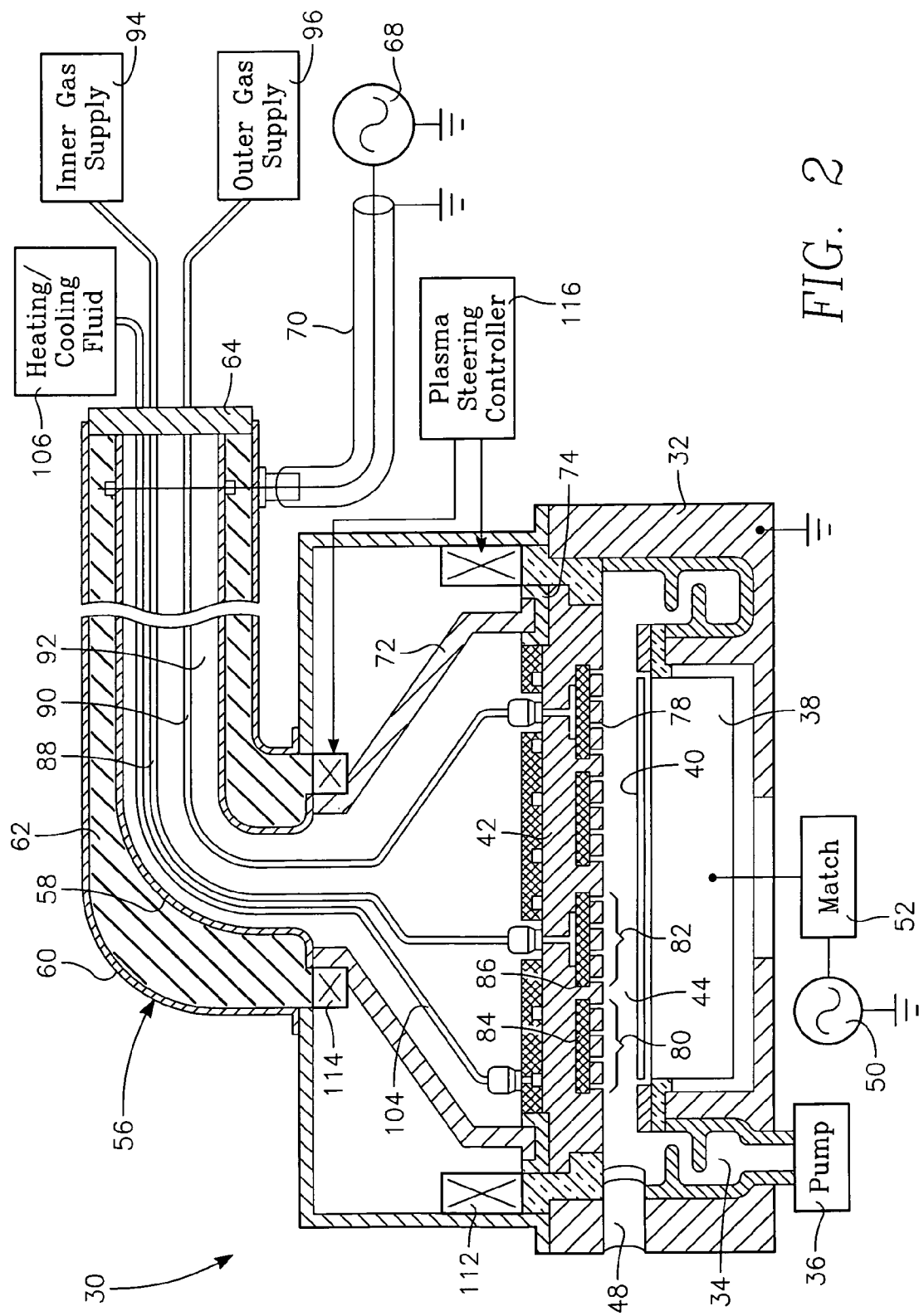
FIG. 2 is a schematic cross-sectional view of a plasma etch reactor in which the invention is advantageously practiced.

The hardmask open process together with other steps in defining the via contact of FIG. 1 may be performed in a capacitively coupled plasma etch chamber 30 schematically illustrated in the cross-sectional view of FIG. 2 and described by Hoffman et al. in U.S. Pat. Nos. 6,853,141 and 6,894,245, both incorporated herein by reference. Hoffman et al. expands upon features of the former in U.S. patent application Ser. No. 11/046,538, filed Jan. 28, 2005 and now published as U.S. patent publication 2005/0178745. The Enabler chamber available from Applied Materials incorporates parts of the disclosed chamber. The etch chamber 30 separately biases the showerhead and the pedestal supporting the wafer and attempts to decouple the VHF source power applied to the showerhead and producing the plasma from the HF source power applied to the pedestal and producing a DC self bias which affects the energy of an etching ion. The chamber 30 also includes careful selection of source frequency and careful coupling of the VHF power into the chamber, features best described in the cited application. Other features to be briefly described greatly improve the uniformity of etching.

The etch chamber 30 includes a main chamber body 32 including a baffled annular pumping port 34 to a vacuum pump 36 allowing the chamber to be pumped to 100 milliTorr and below. A pedestal electrode 38 supports a wafer 40 be etch processed in opposition to a showerhead 42 supplying etching gas into a processing space 44 above the wafer 40. A wafer port 48 with an associated slit valve allows the wafer 40 to be inserted into the chamber 30. An HF power supply 50 RF biases the pedestal electrode 40 through a capacitive matching circuit 52 to produce the DC self bias on the wafer 40. The frequency of the HF power supply 50 may be in the low megahertz range. In some applications not specifically discussed here, two HF power supplies operating respectively at 1.8 MHz and 2.0 MHz may both input to the matching circuit 52. A broader preferred range for the HF frequency is between 1 and 14 MHz.

The RF biasing of the showerhead 42 is carefully controlled through a coaxial stub 56 including an inner conductor 58 and an outer conductor 60 separated by a insulator 62 and terminated by a short 64. The stub 56 has a predetermined length, for example, a quarter wavelength of a VHF frequency that provides both high coupling and a wide output impedance. A VHF power supply 68, for example, operating at 162 MHz, is connected through a coaxial cable 70 to the inner conductor 58 at a distance from the short 64 which provides high power coupling. The other end of the stub 56, the outer conductor 60 is grounded to the chamber body 32 and the inner conductor 58 is connected to a flared conductor 72, which is capacitively coupled to the showerhead 42 through a insulating ring 74 of carefully controlled thickness, which effectively isolates the VHF biasing of the showerhead 42 from the DC self-biasing of the pedestal electrode 38. A broader preferred range for the VHF is between 150 and 325 MHz.

The showerhead 74 contains a large number of apertures 78 to evenly supply processing gas into the processing space 44. However, the apertures are divided into an annular outer zone 80 and an annular inner zone 82 connected via respective foam-filled manifolds 84, 86 and gas supply lines 88, 90 through a bore 92 within the stub 56 to inner and outer gas supplies 94, 96. Thereby, the process gas may be differentially supplied to inner and outer portions of the wafer 40. A typical diameter of the inner zone 82 is 8.1 inches (206 mm) for a 300 mm wafer. Heating or cooling fluid is supplied to the back of the showerhead 44 and returned therefrom through fluid lines 104 passing through the stub bore 92 and connected to a thermal fluid source 106.

The dual zone showerhead provides a mean of tuning the radial distribution of all species of the process gas including neutral atoms or molecules. The ionized species can be separately tuned by two coaxial coils 112, 114 placed in back of the showerhead and supplied with separately controllable amounts of DC current by a plasma steering controller 116 to produce magnetic fields in the processing space 44. The first coil 112 is placed in a radially outer position outside of the showerhead 42 and a short distance above a level of the showerhead 42. The second coil 114 is placed in a radially inner position and a longer distance above the showerhead, preferably adjacent the outside of the top of the flared conductor 72. When approximately equal currents of the same polarity pass through the two coils 112, 114, a cusp-shaped magnetic field is produced having significant radial components in the processing space 44 between the showerhead 42 and the wafer 40, which can steer the ionized components of the process gas.

According to one aspect of the invention, the carbon-based layer is removed by a plasma etch with an etching gas including nitrogen, hydrogen, and carbon monoxide. Preferably, the etching is performed in an etch chamber, such as that of FIG. 1, including magnetic enhancement and a showerhead capacitively biased at a VHF frequency.

Example 1

A hardmask open process has been optimized for an APF layer grown at 400° C. to a thickness of 900 nm on a 300 mm silicon wafer and thereafter covered with the ARC layer and patterned photoresist. The wafer is placed into the etch chamber of FIG. 2 configured for 300 mm wafers. The ARC layer is removed by a conventional etch in which 200 sccm of $CF_4$ is supplied at a pressure of 150 milliTorr while the pedestal electrode is biased with 600 W of 13.56 MHz RF power.

After a transition step, the APF layer is then etched with an etching gas flow of 150 sccm of $N_2$, 450 sccm of $H_2$, and 50 sccm of CO. The different process gases are metered by respective mass flow controllers. The component fractions delivered to the inner and outer zones are the same and, in this example, equal amounts of process gas are delivered to the two zones. The chamber pressure is maintained at 100 milliTorr and the pedestal electrode is held at 40° C. The showerhead electrode is supplied with 1500 W of 162 MHz source power and the pedestal electrode is supplied with 900 W of 13.56 MHz bias power. Five amps of current of the same polarity are passed through each of the coils to produce the cusp-shaped magnetic field. The etch rate for 180s of etching averaged over the wafer is observed to be about 431 nm/min with a non-uniformity of 7.7%.

Example 2

In a second example, the current supplied to the inner coil is reduced to 2A while the current to the outer coil remains at 5A. Other conditions remain the same as in the first example. The average etch rate is observed to increase to 469 nm/min but the non-uniformity increases to 11.5%.

Example 3

In a third example, the 162 MHz source power is increased to 2000 W while other conditions remain the same as in the first example. The average etch rate is observed to be about 549 nm/min with a non-uniformity reduced to 3.1%.

Example 4

In a fourth example, the 162 MHz source power is set to 2000 W and the supply of $N_2$ is increased to 300 sccm and the supply of $H_2$ is decreased to 300 sccm. Otherwise the conditions of the first example are used. The average etch rate is observed to be 516.5 nm/min with a non-uniformity of 2.1%. There is some non-uniformity in the hole profile across the wafer.

Example 5

In a fifth example, two process conditions are compared to determine the effect of varying the ratio of nitrogen to hydrogen. In one set of tests, the hydrogen flow is 450 sccm and the nitrogen flow is 150 sccm. In the other set, the hydrogen flow is 300 sccm and the nitrogen flow is 300 sccm. That is, the total flow of the two gases believed primarily responsible for the etching is maintained the same. The carbon monoxide is believed to be primarily useful in passivating the sidewall and thus improving the profile.

Figure 3:
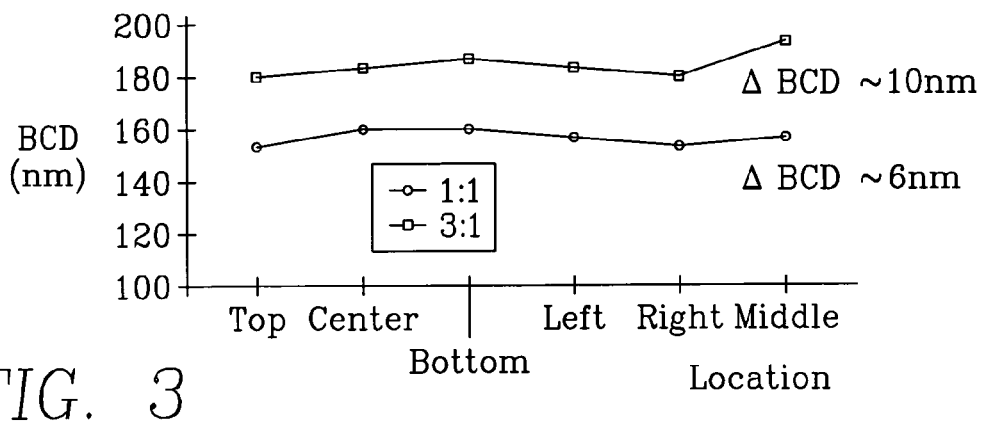
FIG. 3 is a chart illustrating the uniformity and profile characteristics for two different ratios of two of the etching gases.

The results are summarized in the chart of FIG. 3, which shows the bottom critical dimension (BCD), that is, the width at the bottom at different locations on the wafer for the two $H_2/N_2$ flow ratios. The chart also displays the variance of the BCD. Generally the lower $H_2/N_2$ ratio below 2:1 provides smaller BCD with better BCD uniformity. Also, more ARC remains at the end of the APF etch with the lower ratio. However, at the lower ratio there is more undercutting at the DARC/APF interface, which contributes to a less vertical profile. For other chamber optimizations, it is believed that the preferred $H_2/N_2$ flow ratio falls within the range of 3:1 to 1:2.

Similar results are observed when the source power is increased to 2000 W.

Example 7

Figure 4:
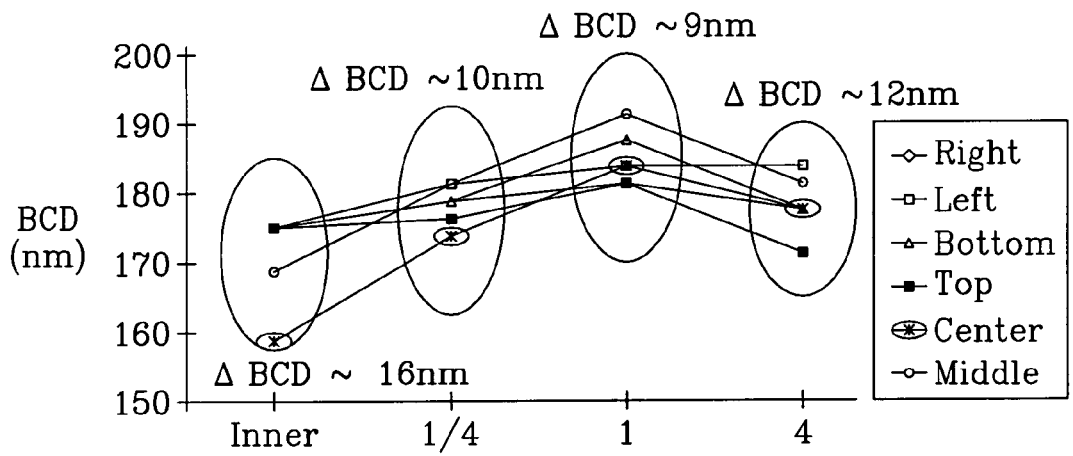
FIG. 4 is a chart illustrating the uniformity and profile characteristics for different ratios of flow of the etching gases to the center and edge of the wafer.

In a seventh example, the ratio of the flow of process gases between the inner and outer zones is varied while otherwise maintaining the process conditions of the first example. The results in the chart of FIG. 4 show the BCD at six points on the wafer for no process gas in the outer zone and for the ratios for outer to inner flow rates of ¼, 1, and 4. It is seen that more edge flow increases the BCD particularly at the center while solving the polymer residue at the top of the profile. The effects arise from less gas being supplied to the center and the increased pumping. Also, the gas residence time is increased. The higher edge flow also improves the uniformity. Generally flow ratios of between ½ to 2 produce better results although that APF at the unity flow ratio is about 10% lower.

Example 8

Figure 5:
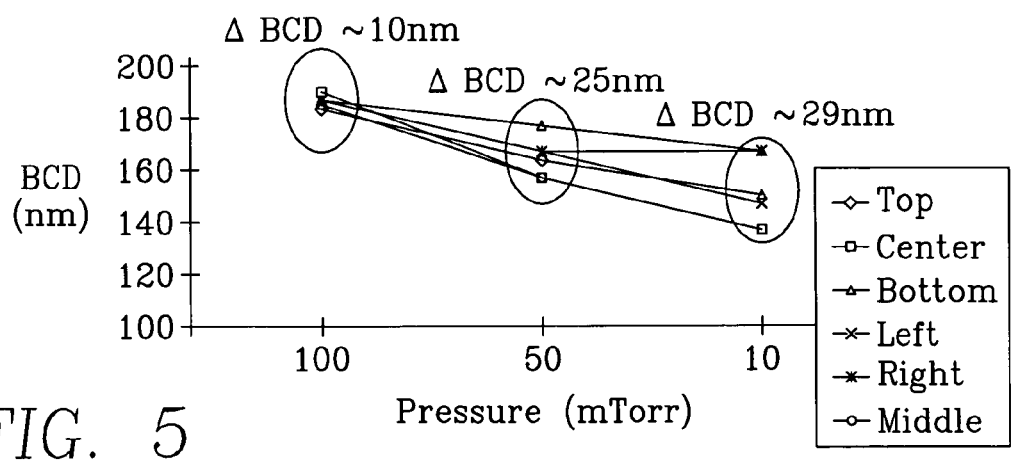
FIG. 5 is a chart illustrating the uniformity and profile characteristics as a function of chamber pressure.

In an eighth example, the chamber pressure is varied while otherwise the conditions of the first example are followed. The results of FIG. 5 show that at pressures above 50 milliTorr, the vertical profile is improved and the uniformity of BCD is greatly improved. It is believed that for differently optimized recipes, the minimum of the optimum pressure range may be reduced to 20 milliTorr.

All the described recipes include an etching gas having active constituents of which at least 90% are hydrogen and nitrogen. It is possible to add an inert gas such as argon, but it is expected to have little effect on the APF etching chemistry.

APF is being developed by others to be grown at 550° C. and is believed to be harder than the 400° C. APF. However, the same etching chemistry of $H_2/N_2/CO$ should provide similarly good results although with varying optimization. The etching chemistry is applicable also to other carbon-based materials having similar compositions.

It is possible to use intermediate hardmask layers between the carbon-based layer and the photoresist. The ARC layer in fact acts partially as a hardmask layer once the ARC layer has been etched through and the chemistry changed for etching carbon-based material. The carbon-based hardmask greatly simplifies the etching of the underlying layer, particular of low-k dielectric or very thick oxide layers desired for some applications. The carbon-based material is relatively impervious to fluorine-based plasma etching, which is particularly effective for oxide etching. That is, very high selectivity is available for etching oxide over the defining carbon-hard mask.

The hard mask can be defined with a relatively thin photoresist layer, thus allowing very narrow mask features, but the carbon-based hardmask can be deeply and vertically etched using the chemistry of the invention. The hardmask can also be etched in the same plasma etch reactor used for the overlying ARC layer and the underlying oxide or other layer for which it defines the etch patterning.

The invention claimed is:

1. A method of etching a carbon-based layer formed over a substrate and comprising at least 40 at % carbon, the method comprising exposing the carbon-based layer to a plasma of an etching gas comprising hydrogen, nitrogen, and carbon monoxide; and placing the substrate into a plasma etch chamber having a pedestal electrode supporting the substrate and biased by an RF power supply operating at an HF frequency through a matching circuit and a showerhead electrode in opposition to the pedestal through which the etching gas is supplied and biased by a second RF power supply operating at VHF frequency higher than the HF frequency and applied to a stub circuit capacitively coupled to the showerhead electrode.

2. The method of claim 1, further comprising passing current through two coaxial coils disposed in back of the showerhead at different radii from a central axis of the chamber.

3. A method of etching a dielectric layer structure including a dielectric layer and a carbon-based layer overlying the dielectric layer and comprising at least 40 at % carbon and between 10 and 60 at % hydrogen, comprising the steps of:

patterning a photoresist layer overlying the carbon-based layer;

a first step of plasma etching the carbon-based layer with an etching gas comprising hydrogen gas, nitrogen gas, and carbon monoxide gas according to the patterning of the photoresist layer; and a second step of plasma etching the dielectric layer through the plasma etched carbon-based layer with an etching gas including a fluorocarbon;

wherein the first and second steps are performed in a plasma etch reaxtor having an RF biased pedestal electrode supporting a substrate in which the dielectric layer structure is formed and a showerhead electrode through which the etching gas is flowed and which is capacitively biased by a VHF power supply.

4. The method of claim 3, wherein the carbon-based layer comprises at least 60 at % carbon and between 10 and 40 at % hydrogen.

5. The method of claim 4, wherein the carbon-based layer has a thickness of at least 400 nm.

6. The method of claim 4, wherein the dielectric layer structure additionally includes an anti-reflection layer overlying the carbon-based layer and on which the photoresist layer is pattern and further including a third step of plasma etching the anti-reflection layer.

7. The method of claim 4, wherein the first, second, and third steps are performed in the plasma etch reactor having RF biased pedestal electrode supporting the substrate in which the dielectric layer structure is formed.

8. The method of claim 3, wherein the etching gas has active components consisting essentially of hydrogen gas, nitrogen gas, and carbon monoxide gas.

9. The method of claim 3, wherein the VHF power supply has a VHF frequency in the range of 150 to 325 MHz.

* * * * *